(12) United States Patent
Xie

(10) Patent No.: US 10,262,741 B2
(45) Date of Patent: Apr. 16, 2019

(54) READ AND WRITE CONTROL CIRCUIT AND METHOD OF FLASH CHIP, AND AMOLED APPLICATION CIRCUIT

(71) Applicant: Boe Technology Group Co., Ltd., Beijing (CN)

(72) Inventor: Hongjun Xie, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 343 days.

(21) Appl. No.: 15/319,885

(22) PCT Filed: Mar. 24, 2016

(86) PCT No.: PCT/CN2016/077223
§ 371 (c)(1),
(2) Date: Dec. 19, 2016

(87) PCT Pub. No.: WO2016/180093
PCT Pub. Date: Nov. 17, 2016

(65) Prior Publication Data
US 2017/0148521 A1 May 25, 2017

(30) Foreign Application Priority Data
May 8, 2015 (CN) .......................... 2015 1 0231355

(51) Int. Cl.
*G06F 3/06* (2006.01)
*G11C 5/14* (2006.01)
(Continued)

(52) U.S. Cl.
CPC .............. *G11C 16/16* (2013.01); *G06F 3/065* (2013.01); *G06F 3/0619* (2013.01);
(Continued)

(58) Field of Classification Search
CPC ......... G11C 5/141; G11C 5/148; G11C 16/10; G11C 16/16; G11C 16/20; G11C 16/26;
(Continued)

(56) References Cited

U.S. PATENT DOCUMENTS 7,502,813 B2 *  3/2009  Ljung ..................... G06F 8/654
8,046,528 B2 * 10/2011  Chu ..................... G06F 12/0246
                                                        365/185.03
(Continued)

FOREIGN PATENT DOCUMENTS

CN          101079010          11/2007
CN          101079010 A        11/2007
(Continued)

OTHER PUBLICATIONS

First Office Action for Chinese Patent Application No. 201510231355.6 dated Nov. 14, 2017.
(Continued)

*Primary Examiner* — Harry W Byrne
*Assistant Examiner* — R Lance Reidlinger
(74) *Attorney, Agent, or Firm* — Calfee, Halter & Griswold LLP

(57) ABSTRACT

A read and write control circuit for a flash chip is disclosed which includes a timing control circuit for generating a read and write timing signal for the flash chip, and a first non-volatile memory for storing a plurality of flags corresponding to a plurality of blocks in the flash chip, each of the flags indicating whether a respective one of the blocks that corresponds thereto has been written to normally. Also disclosed is a read and write control method of a flash chip, as well as an AMOLED application circuit having the read and write control circuit for use in an electrical compensation mechanism.

16 Claims, 3 Drawing Sheets

(51) Int. Cl.
*G06F 12/00* (2006.01)
*G11C 16/10* (2006.01)
*G11C 16/16* (2006.01)
*G11C 16/20* (2006.01)
*G11C 16/26* (2006.01)
*G11C 16/32* (2006.01)

(52) U.S. Cl.
CPC ............ *G06F 3/0688* (2013.01); *G06F 12/00* (2013.01); *G11C 5/141* (2013.01); *G11C 5/148* (2013.01); *G11C 16/10* (2013.01); *G11C 16/20* (2013.01); *G11C 16/26* (2013.01); *G11C 16/32* (2013.01)

(58) Field of Classification Search
CPC ....... G11C 16/32; G06F 3/0619; G06F 3/065; G06F 3/0688; G06F 12/00
See application file for complete search history.

(56) References Cited

U.S. PATENT DOCUMENTS

| | | | |
|---|---|---|---|
| 8,397,101 B2* | 3/2013 | Goss | G06F 11/1004 711/209 |
| 8,743,622 B2* | 6/2014 | Tanzawa | G11C 16/3459 365/185.03 |
| 9,563,509 B2* | 2/2017 | Han | G06F 11/1076 |
| 9,704,438 B2* | 7/2017 | Lee | G09G 3/3233 |
| 2014/0068157 A1 | 3/2014 | Makuni et al. | |
| 2016/0253960 A1 | 9/2016 | Xie | |

FOREIGN PATENT DOCUMENTS

| | | |
|---|---|---|
| CN | 101539891 | 9/2009 |
| CN | 101539891 A | 9/2009 |
| CN | 102737715 A | 10/2012 |
| CN | 103176920 | 6/2013 |
| CN | 103176920 A | 6/2013 |
| CN | 104064141 A | 9/2014 |
| CN | 104810055 | 7/2015 |

OTHER PUBLICATIONS

The International Search Report for PCT/CN2016/077223 dated Jun. 23, 2016.

* cited by examiner

READ AND WRITE CONTROL CIRCUIT AND METHOD OF FLASH CHIP, AND AMOLED APPLICATION CIRCUIT

RELATED APPLICATIONS

The present application is the U.S. national phase entry of PCT/CN2016/077223, with an international filing date of Mar. 24, 2016, which claims the benefit of Chinese Patent Application No. 201510231355.6, filed on May 8, 2015, the entire disclosures of which are incorporated herein by reference.

TECHNICAL FIELD

The present disclosure relates to the field of active matrix organic light-emitting diode (AMOLED) module circuits, and particularly to a read and write control circuit and method of a flash chip. The present disclosure further relates to an AMOLED application circuit.

BACKGROUND

There is little opportunity for a flash chip to be written to in a conventional design of a flat panel display circuit. Generally, data is written to the flash chip before the display product leaves the factory, and when the flash chip is in use, the data is simply read out, with no write operation needed.

Nowadays AMOLED modules are provided with electrical compensation functionality, which requires not only write operations to the flash chip before the product leaves the factory, but also read and write operations to the flash chip when the product is in use. However, an abnormal event, such as a sudden powering down due to e.g. a power outage or an unintentional disconnection of the power plug, may occur when the display product is in use. In this case, if the flash is in a write state, the abnormal event will cause a failure of the write operation, leading to data loss in a corresponding block of the flash. As a write operation cannot be performed to the flash before the corresponding block is erased, it is possible that when an abnormal event (e.g., a power outage) occurs, the compensation data previously stored has been erased while new compensation data has not been written yet. As a result, after re-energization of the display, the displayed content will be abnormal in some regions of the display.

Therefore, there is a need for an improved read and write control circuit and method of the flash chip.

SUMMARY

It would be advantageous to achieve a read and write control circuit and method of a flash chip which may avoid data loss resulting from an abnormal event such as a powering down. It would also be desirable to provide an AMOLED application circuit having such a read and write control circuit for a flash chip.

According to a first aspect of the present disclosure, a read and write control circuit for a flash chip is provided, including a timing control circuit for generating a read and write timing signal for the flash chip, and a first non-volatile memory for storing a plurality of flags corresponding to a plurality of blocks in the flash chip, each of the flags indicating whether a respective one of the blocks that corresponds thereto has been written to normally. The timing control circuit is configured to perform the following operations when data is to be written to one of the blocks in the flash chip: generating a timing signal for copying current data in the block to be written to to a non-volatile backup memory area; controlling the first non-volatile memory to set the flag corresponding to the block to be written to to a first value indicative of an abnormal write state; generating a timing signal for erasing the block to be written to; generating a timing signal for writing the data to be written to the block; and setting the flag corresponding to the block to a second value indicative of a normal write state upon completion of the writing. The timing control circuit is further configured to determine, when data is to be read from one of the blocks in the flash chip after re-energization of the flash chip, whether the data should be read from the block in the flash chip or from the non-volatile backup memory area in dependence on the indication of the flag in the first non-volatile memory.

According to a second aspect of the present disclosure, a read and write control method of a flash chip is provided, including: when data is to be written to a block in the flash chip, generating a timing signal for copying data in the block to be written to to a non-volatile backup memory area, setting a flag corresponding to the block to be written to to a first value indicative of an abnormal write state, generating a timing signal for erasing the block, generating a timing signal for writing the data to be written to the block, and setting the flag corresponding to the block to a second value indicative of a normal write state upon completion of the writing; and when data is to be read from a block in the flash chip after re-energization of the flash chip, determining whether the data should be read from the block in the flash chip or from the non-volatile backup memory area in dependence on the indication of the flag.

According a third aspect of the present disclosure, an AMOLED application circuit is provided including a flash chip and a read and write control circuit according to any one of above aspects. The flash chip is configured to store electrical compensation data for AMOLEDs, and the read and write control circuit is configured to control writing and reading of the electrical compensation data to and from the flash chip.

The inventive concept of the present disclosure is to achieve preservation of original data contained in the flash chip before the abnormal event such as a powering down by setting flags that correspond to the blocks in the flash chip and by providing a backup storage space.

These and other aspects of the present disclosure will be apparent from and elucidated with reference to the embodiment(s) described hereinafter.

DETAILED DESCRIPTION

Embodiments of the present disclosure will be described in detail with reference to the drawings.

Figure 1:
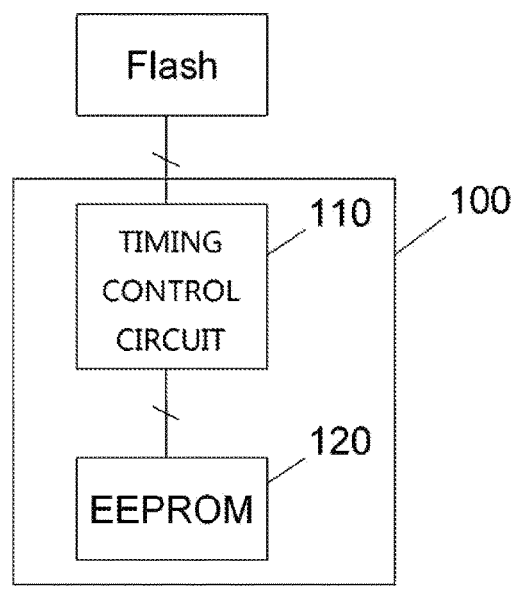
FIG. 1 schematically illustrates a read and write control circuit for a flash chip according to an embodiment of the present disclosure.

FIG. 1 schematically illustrates a read and write control circuit 100 for a flash chip according to an embodiment of the present disclosure. The read and write control circuit 100 includes a timing control circuit 110 and a first non-volatile memory 120. In FIG. 1, the first non-volatile memory 120 is illustrated as an electrically erasable programmable read-only memory (EEPROM).

The timing control circuit 110 generates read and write timing signals for the flash chip. Control, address and data signals are carried by these read and write timing signals to the flash chip via the I/O interfaces of the flash chip such that programming (burning), erasing and writing operations can be performed to the flash. It is to be noted that although the interfaces of the flash may vary from product to product or from manufacturer to manufacturer, the read and write timing sequences for the flash chip, be it a NOR flash or a NAND flash, is known in the art, and hence is not discussed in detail herein.

The first non-volatile memory 120 is used to store a plurality of flags that correspond to a plurality of blocks in the flash chip, and each of the flags indicates whether a respective one of the blocks that corresponds thereto has been written to normally. As shown in the figure, the first non-volatile memory 120 may be an EEPROM, which features that any one of its bytes can be accessed and modified randomly, and that either 0 or 1 can be written to every bit. In the application of this embodiment, the EEPROM may be advantageous because the modification of the flag is performed in bits. However, other types of non-volatile memories are possible.

When data is to be written to a block in the flash chip, the timing control circuit 120 performs the following operations:

generating a timing signal for copying data in the block to be written to to a non-volatile backup memory area (not shown in FIG. 1). In accordance with this timing signal, the circuit will perform a combined operation, i.e., reading the data from the corresponding block in the flash chip first, and then writing the read data to the non-volatile backup memory area.

controlling the first non-volatile memory 120 to set the flag corresponding to the block to be written to to a first value indicative of an abnormal write state. The flag may generally be set to 1 or 0. By way of example, the first value may be 0.

generating a timing signal for erasing the block. In accordance with this timing signal, the corresponding block in the flash chip will be erased.

generating a timing signal for writing the data to be written to the block. In accordance with this signal, the data will be written to the corresponding block in the flash chip.

setting the flag corresponding to the block to a second value indicative of a normal write state upon completion of the writing. By way of example, the second value may be 1.

Accordingly, when data is to be read from a block in the flash chip after re-energization of the flash chip, the timing control circuit 110 determines whether the data should be read from the block in the flash chip or from the non-volatile backup memory area in dependence on the indication of the flag in the first non-volatile memory 120. Specifically, if the flag in the first non-volatile memory 120 has the second value (which indicates a normal write state), the timing control circuit 110 generates a timing signal such that the data is read from the block, and if the flag in the first non-volatile memory has the first value (which indicates an abnormal write state), the timing control circuit 110 generates a timing signal such that the data is read from the non-volatile backup memory area, which data is a backed-up version of the data in the block corresponding to the flag before the powering down.

It should be appreciated that the timing control circuit 110 may be either a part of a processor such as a central processing unit (CPU), a digital signal processor (DSP), or a micro-controller, or an individual circuit element separate from the processor. In the former case, the functionality of the timing control circuit 110 can be implemented by the processor issuing read and write operation commands to the memory space (of a flash chip or an EEPROM, for example) and potentially to a memory control circuit. In the latter case, the timing control circuit 110 may be implemented as an application specific integrated circuit (ASIC) or a programmable logic circuit (e.g., a field programmable gate array (FPGA)).

Figure 2:
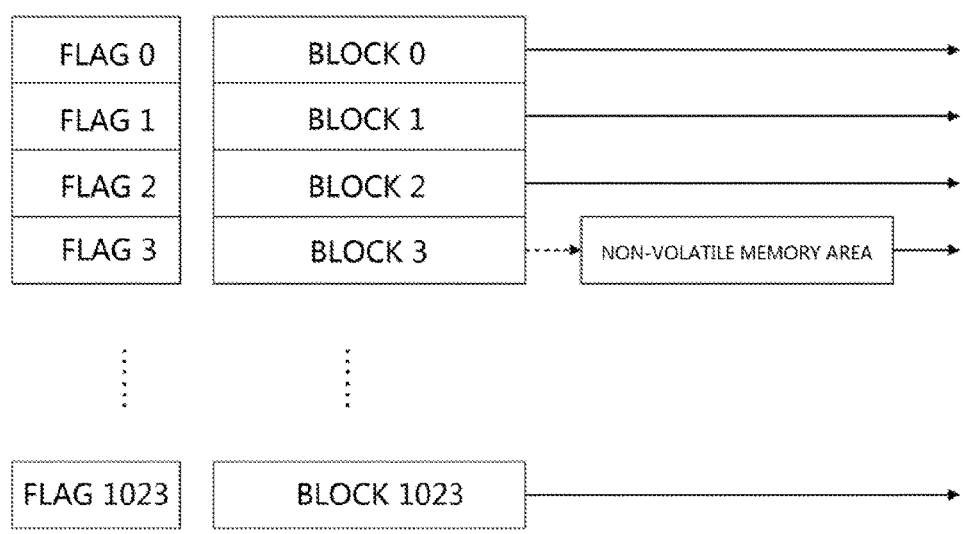
FIG. 2 schematically illustrates a process for reading from and writing to a flash chip in the case that an abnormal write operation has occurred according to an embodiment of the present disclosure.

FIG. 2 schematically illustrates a process for reading from and writing to a flash chip in the case that an abnormal write operation has occurred according to an embodiment of the present disclosure. Assume that the flash chip has 1024 blocks each represented by block 1, block 2 . . . block 1023. Each of the blocks has a respective flag of 1 bit size, and the flags are represented by flag 0, flag 1 . . . flag 1023, respectively. As described above, the flag indicates whether the block has been written to normally, with 1 indicating a normal write state and 0 an abnormal write state. When any one of the blocks is to be written to, the original data of this block is copied to the non-volatile backup memory area, and then the flag corresponding to this block is set to 0. Next, the block is erased and new data is written to the block. The flag corresponding to the block is set to 1 upon the completion of the writing. With the writing operation to this block completed, a writing operation to the next block can be performed. Write operations are performed to all of the blocks following such steps.

The solid arrow in FIG. 2 indicates a read location upon re-energization after an abnormal event. If no powering down occurs, all of the block flags have a value of 1. In the next energization, the timing control circuit 110 will start by reading the flag in the first non-volatile memory 120. As all of the flags have a value of 1, the timing control circuit 110 does not read data from the non-volatile backup memory area, but from the block in the flash chip directly. If an abnormal event such as a powering down occurs when a certain block (e.g., block 3 in the figure) is being written to, the flag corresponding to this block (e.g., flag 3 in the figure) is set to 0, and the other flags are set to 1. In the next energization, the timing control circuit 110 will start by reading the flag in the first non-volatile memory 120. If the flag corresponding to the block has a value of 1, the timing control circuit 110 will read data from the block. If the flag corresponding to the block has a value of 0, the timing control circuit 110 will read data from the non-volatile backup memory area, which data is a backed-up version of the data in the block before the powering down. It should also be appreciated that in the initial default state, each of the flags corresponding to the blocks is set to 1 to indicate a normal write state.

Figure 3:
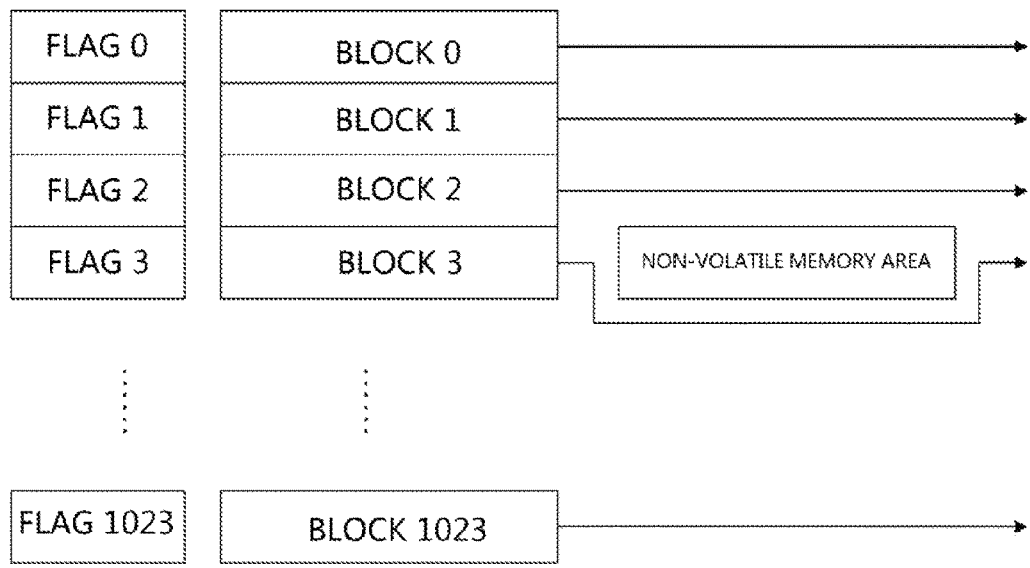
FIG. 3 schematically illustrates a process for reading from and writing to a flash chip in the case that no abnormal write state has occurred according to an embodiment of the present disclosure.

FIG. 3 schematically illustrates a process for reading from and writing to a flash chip in the case that no abnormal write state has occurred according to an embodiment of the present disclosure. As illustrated, since no abnormal event such as a powering down has occurred, all of the block flags have a value of 1 such that the timing control circuit 110 does not read data from the non-volatile backup memory area, but from the block in the flash chip directly, as shown by the solid arrow in the figure.

Optionally, the non-volatile backup memory area shown in FIGS. 2 and 3 may be a block in the flash chip. Such an arrangement allows all the data operations to be completed within the flash chip during a backup process, and hence facilitates reduction of the system complexity and processing time. However, as a block of the flash chip, the non-volatile backup memory area is also confronted with the risk of data loss resulting from an abnormal event during a writing process. Alternatively, the non-volatile backup memory area may be mapped to an off-chip non-volatile memory device (e.g., an EEPROM or another readable and writable non-volatile memory) that is separate from the flash chip. Optionally, this off-chip non-volatile memory device may have a storage space equal to the size of a block of the flash chip. While this is advantageous for a reduced cost, the off-chip non-volatile memory device may of course have a storage space larger than the size of a block. Alternatively, the non-volatile backup memory area may be mapped to the first non-volatile memory 110 as described above. This also facilitates reduction of the cost since the number of memory devices used is reduced.

Figure 4:
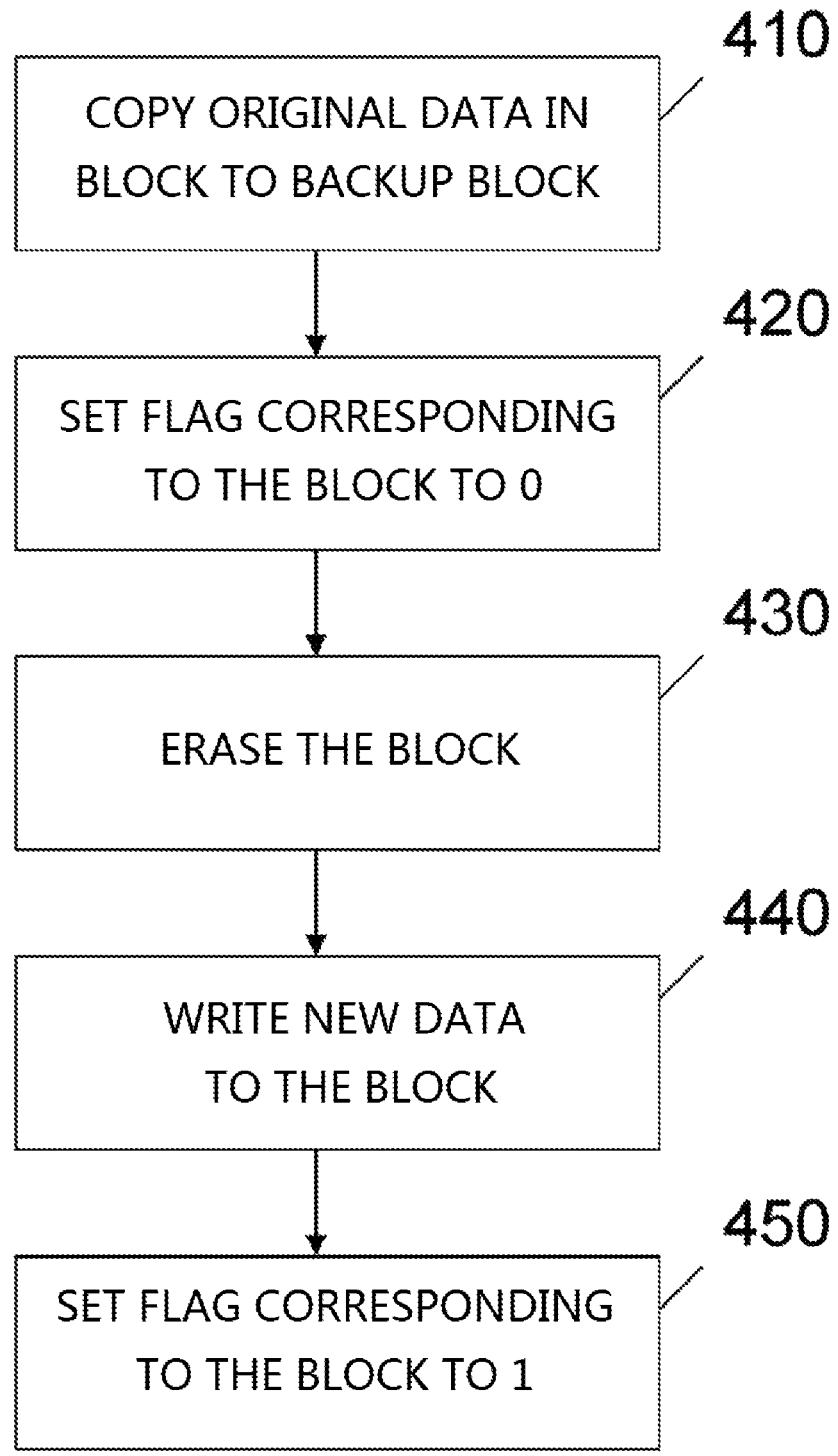
FIG. 4 is a flow chart of a read and write control method of a flash chip according to an embodiment of the present disclosure.

FIG. 4 is a flow chart of a read and write control method of a flash chip according to an embodiment of the present disclosure. When a block in the flash chip is to be written to, the following operations may be performed:

At step 410, a timing signal is generated for copying data in the block to be written to to a non-volatile backup memory area. In accordance with this timing signal, the circuit will perform a combined operation, i.e., reading the data from the corresponding block in the flash chip first, and then writing the read data to the non-volatile backup memory area.

At step 420, the flag corresponding to the block to be written to is set to a first value indicative of an abnormal write state. As described above, the first value may be 0, for example.

At step 430, a timing signal is generated for erasing the block. In accordance with this timing signal, the corresponding block in the flash chip will be erased.

At step 440, a timing signal is generated for writing the data to be written to the block. In accordance with this signal, the data will be written to the corresponding block in the flash chip.

At step 450, the flag corresponding to the block is set to a second value indicative of a normal write state upon completion of the writing. As described above, the second value may be 1, for example.

It is to be noted that if no abnormal event such as a powering down occurs, all of the steps 410 to 450 will be performed, and that if an abnormal event occurs after the block is erased, the steps 440 and 450 will not be performed.

With the writing operation to this block completed, a writing operation to the next block can be performed. Write operations are performed to all of the blocks following such steps.

Accordingly, when data is to be read from a block in the flash chip after re-energization of the flash chip, it is determined whether the data should be read from the block in the flash chip or from the non-volatile backup memory area in dependence on the indication of the flag. Specifically, if the flag corresponding to the block has the second value (which indicates a normal write state), a timing signal is generated for reading data from the block such that the data is read from the block, and if the flag corresponding to the block has the first value (which indicates an abnormal write state), a timing signal is generated for reading data from the non-volatile backup memory area such that the data is read from the non-volatile backup memory area, which data is a backed-up version of the data in the block corresponding to the flag before the abnormal event.

According to another embodiment of the present disclosure, an AMOLED application circuit using an electrical compensation mechanism is provided. The AMOLED application circuit comprises a flash chip and a read and write control circuit as described above. The flash chip can be configured to store electrical compensation data, and the read and write control circuit can be configured to control writing and reading of the electrical compensation data to and from the flash chip.

It can be known from the above discussion that when the abnormal event occurs, the data stored in the block that has been written to is the updated compensation data, the data stored in the block that has not been written to is the un-updated compensation data, and the data backed up in the non-volatile backup memory area for the block that is being written to when the abnormal event occurs is also the un-updated data. As corresponding flags have been set for the blocks in the flash chip, data could be read from each of the blocks (for a block that has been written to abnormally, the data is read from the non-volatile backup memory area) in dependence on the indication of the flags, without the need to wait until the abnormally written block is re-written to. This is favorable for the continuity of the data processing (e.g., displaying). Since there is generally no sudden change in the compensation data and the compensation data in all of the blocks will be updated in a short time (e.g., within a few seconds) after the re-energization, no significant visual difference will be caused.

While several specific implementation details are contained in the above discussions, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations are to be performed in the particular order shown or in a sequential order, or that all illustrated operations are to be performed to achieve desirable results.

Various modifications, adaptations to the foregoing exemplary embodiments of this disclosure may become apparent to those skilled in the relevant arts in view of the foregoing description, when read in conjunction with the accompanying drawings. Any and all modifications will still fall within the scope of the non-limiting and exemplary embodiments of this disclosure. Furthermore, other embodiments of the present disclosure set forth herein will come to mind to one skilled in the art to which these embodiments of the invention pertain having the benefit of the teachings presented in the foregoing descriptions and the associated drawings.

Therefore, it is to be understood that the embodiments of the present disclosure are not to be limited to the specific embodiments disclosed and that modifications and other embodiments are intended to be included within the scope of the appended claims. Although specific terms are used herein, they are used in a generic and descriptive sense only and not for purposes of limitation.

What is claimed is:

1. A read and write control circuit for a flash chip, comprising:
   a timing control circuit for generating a read and write timing signal for the flash chip; and
   a first non-volatile memory for storing a plurality of flags corresponding to a plurality of blocks in the flash chip, each of the plurality of flags indicating whether a corresponding block has been written to normally;
   wherein when data is to be written to one of the plurality of blocks in the flash chip, the timing control chip
      generates a timing signal for copying current data in the corresponding block to a non-volatile backup memory area;
      controls the first non-volatile memory to set a corresponding flag of the corresponding block to a first value indicative of an abnormal write state;
      generates a timing signal for erasing the corresponding block;
      generates a timing signal for writing the data to the corresponding block; and
      sets the corresponding flag of the corresponding block to a second value indicative of a normal write state upon completion of the writing; and
   wherein the timing control circuit is further configured to determine, when data is to be read from the corresponding block in the flash chip after re-energization of the flash chip, whether the data should be read from the corresponding block in the flash chip or from the non-volatile backup memory area in dependence on the indication of the corresponding flag in the first non-volatile memory.

2. The read and write control circuit according to claim 1, wherein the timing control circuit is further configured to
   when data is to be read from one of the plurality of blocks in the flash chip, generate a timing signal for reading the data from the corresponding block in response to the corresponding flag in the first non-volatile memory having the second value, and generate a timing signal for reading the data from the non-volatile backup memory area in response to the corresponding flag in the first non-volatile memory having the first value.

3. The read and write control circuit according to claim 1, wherein the non-volatile backup memory area is one of the plurality of the blocks in the flash chip.

4. The read and write control circuit according to claim 1, wherein the non-volatile backup memory area is mapped to a non-volatile memory device separate from the flash chip.

5. The read and write control circuit according to claim 4, wherein the non-volatile memory device has a memory space larger than or equal to the size of one block of the flash chip.

6. The read and write control circuit according to claim 1, wherein the non-volatile backup memory area is mapped to the first non-volatile memory.

7. The read and write control circuit according to claim 1, wherein the first non-volatile memory is an electrically erasable programmable read-only memory.

8. An AMOLED application circuit comprising a flash chip and a read and write control circuit according to claim 1, wherein the flash chip is configured to store electrical compensation data for AMOLEDs, and wherein the read and write control circuit is configured to control writing and reading of the electrical compensation data to and from the flash chip.

9. An AMOLED application circuit comprising a flash chip and a read and write control circuit according to claim 2, wherein the flash chip is configured to store electrical compensation data for AMOLEDs, and wherein the read and write control circuit is configured to control writing and reading of the electrical compensation data to and from the flash chip.

10. An AMOLED application circuit comprising a flash chip and a read and write control circuit according to claim 3, wherein the flash chip is configured to store electrical compensation data for AMOLEDs, and wherein the read and write control circuit is configured to control writing and reading of the electrical compensation data to and from the flash chip.

11. An AMOLED application circuit comprising a flash chip and a read and write control circuit according to claim 4, wherein the flash chip is configured to store electrical compensation data for AMOLEDs, and wherein the read and write control circuit is configured to control writing and reading of the electrical compensation data to and from the flash chip.

12. An AMOLED application circuit comprising a flash chip and a read and write control circuit according to claim 5, wherein the flash chip is configured to store electrical compensation data for AMOLEDs, and wherein the read and write control circuit is configured to control writing and reading of the electrical compensation data to and from the flash chip.

13. An AMOLED application circuit comprising a flash chip and a read and write control circuit according to claim 6, wherein the flash chip is configured to store electrical compensation data for AMOLEDs, and wherein the read and write control circuit is configured to control writing and reading of the electrical compensation data to and from the flash chip.

14. An AMOLED application circuit comprising a flash chip and a read and write control circuit according to claim 7, wherein the flash chip is configured to store electrical compensation data for AMOLEDs, and wherein the read and write control circuit is configured to control writing and reading of the electrical compensation data to and from the flash chip.

15. A read and write control method of a flash chip, comprising:
   when data is to be written to a block in the flash chip:
      generating a timing signal for copying data in the block to be written to to a non-volatile backup memory area;
      setting a flag corresponding to the block to be written to to a first value indicative of an abnormal write state;
      generating a timing signal for erasing the block;
      generating a timing signal for writing the data to be written to the block; and
      setting the flag corresponding to the block to a second value indicative of a normal write state upon completion of the writing; and when data is to be read from a block in the flash chip after re-energization of the flash chip:
determining whether the data should be read from the block in the flash chip or from the non-volatile backup memory area in dependence on the indication of the flag.

16. The read and write control method according to claim 15, wherein the step of determining comprises generating a timing signal for reading the data from the block if the flag has the second value, and generating a timing signal for reading the data from the non-volatile backup memory area if the flag has the first value.

\* \* \* \* \*